(12) United States Patent
Zhang et al.

(10) Patent No.: US 10,933,768 B2
(45) Date of Patent: Mar. 2, 2021

(54) ELECTRIFIED VEHICLE MEASUREMENT ERROR COMPENSATING CHARGE VOLTAGE REQUEST

(71) Applicant: FORD GLOBAL TECHNOLOGIES, LLC, Dearborn, MI (US)

(72) Inventors: Yuan Zhang, Southgate, MI (US); Jeffery R. Grimes, Canton, MI (US); Navid Rahbari Asr, Livonia, MI (US); Lila Ghannam, Northville, MI (US); Changjian Hu, Southgate, MI (US); Kevin Vander Laan, Bloomfield Hills, MI (US); Matthew Roger Dedona, Northville, MI (US)

(73) Assignee: Ford Global Technologies, LLC., Dearborn, MI (US)

( * ) Notice: Subject to any disclaimer, the term of this patent is extended or adjusted under 35 U.S.C. 154(b) by 354 days.

(21) Appl. No.: 15/997,243

(22) Filed: Jun. 4, 2018

(65) Prior Publication Data
US 2019/0366852 A1    Dec. 5, 2019

(51) Int. Cl.
*B60L 58/12*    (2019.01)
*G01R 31/3835*    (2019.01)

(52) U.S. Cl.
CPC .......... *B60L 58/12* (2019.02); *G01R 31/3835* (2019.01)

(58) Field of Classification Search
CPC combination set(s) only.
See application file for complete search history.

(56) References Cited

U.S. PATENT DOCUMENTS

| 9,846,202 B2 | 12/2017 | Kim | |
| 2008/0219032 A1* | 9/2008 | Stancu | .................. H02M 3/156 363/21.01 |
| 2016/0200201 A1* | 7/2016 | Luedtke | .................. B60L 50/61 307/10.1 |
| 2017/0225584 A1 | 8/2017 | Jin et al. | |

* cited by examiner

*Primary Examiner* — Robert Grant
(74) *Attorney, Agent, or Firm* — David B. Kelley; Brooks Ktishman P.C.

(57) ABSTRACT

A vehicle charging system includes a charger configured to adjust an output voltage to achieve a voltage request and output a measured output voltage. The vehicle charging system further includes a controller programmed to measure a terminal voltage of a traction battery being charged and receive the measured output voltage from the charger. The controller is further programmed to output the voltage request as a sum of a full charge voltage and an estimated voltage measurement error between the measured output voltage and the terminal voltage.

12 Claims, 2 Drawing Sheets

ELECTRIFIED VEHICLE MEASUREMENT ERROR COMPENSATING CHARGE VOLTAGE REQUEST

TECHNICAL FIELD

This application generally relates to a charging system for an electrified vehicle.

BACKGROUND

Hybrid-electric and electric vehicles use stored electrical energy to provide propulsion. The vehicles may be plugged into an external charger to receive energy for storage and later use. The amount of time required to fully charge the vehicle depends on a variety of factors. For example, state of charge of the battery, power capability of charge station, and charging strategy. Under some conditions, the amount of time may be affected by measurement errors within the system. These can result in increased charge times and increased energy usage.

SUMMARY

A vehicle includes a charger configured to adjust an output voltage to satisfy a voltage request, and to output a measured output voltage. The vehicle further includes a traction battery and a controller programmed to measure a terminal voltage of the traction battery, and to receive the measured output voltage and output the voltage request as a sum of a full charge voltage and an estimated voltage measurement error between the measured output voltage and the terminal voltage.

The controller may be further programmed to estimate the estimated voltage measurement error as a difference between the measured output voltage and the terminal voltage. The controller may be further programmed to estimate the estimated voltage measurement error as a sum of a first predetermined percentage of a previously estimated voltage measurement error and a second predetermined percentage of a difference between the measured output voltage and the terminal voltage. The controller may be further programmed to limit the difference to be no less than zero. A sum of the first predetermined percentage and the second predetermined percentage may be one hundred percent.

A battery management system includes a controller programmed to receive a charger voltage value from a charger, measure a traction battery voltage during charging, and output a voltage request to the charger that is a sum of a predetermined voltage and an estimated measurement error that includes a first predetermined percentage of a previously estimated measurement error and a second predetermined percentage of a difference between the charger voltage value and the traction battery voltage.

The first predetermined percentage may be zero and the second predetermined percentage may be one hundred percent. A sum of the first predetermined percentage and the second predetermined percentage may be one hundred percent. The controller may be further programmed to generate the estimated measurement error as a sum of the first predetermined percentage of the previously estimated measurement error and the second predetermined percentage of the difference between the charger voltage value and the traction battery voltage, wherein the sum is limited to be no less than zero. The predetermined voltage may be a voltage level at which a traction battery represented by the traction battery voltage is fully charged. The predetermined voltage may be a product of a battery cell full-charge voltage and a number of cells in a traction battery under control of the controller.

A method includes operating a charger to drive a charger output voltage to satisfy a voltage request received from a controller. The method further includes receiving, by the controller, a measured charger output voltage from the charger and outputting the voltage request to the charger controller as a sum of a battery full charge value and a voltage measurement error between the measured charger output voltage and a measured battery voltage.

The method may further include estimating, by the controller, the voltage measurement error as a difference between the measured charger output voltage and the measured battery voltage. The method may further include limiting, by the controller, the voltage measurement error to be no less than zero. The method may further include estimating, by the controller, the voltage measurement error as a sum of a first predetermined percentage of a previously output voltage measurement error and a second predetermined percentage of a difference between the measured charger output voltage and the measured battery voltage. The method may further include limiting, by the controller, the difference between the measured charger output voltage and the measured battery voltage to be no less than zero. A sum of the first predetermined percentage and the second predetermined percentage may be one hundred percent. The battery full charge value may be a voltage at which a corresponding battery is fully charged. The method may further include estimating, by the controller and responsive to a rate of change of a difference between the measured charger output voltage and the measured battery voltage exceeding a predetermined rate, the voltage measurement error as a sum of a first predetermined percentage of a previously output voltage measurement error and a second predetermined percentage of the difference.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
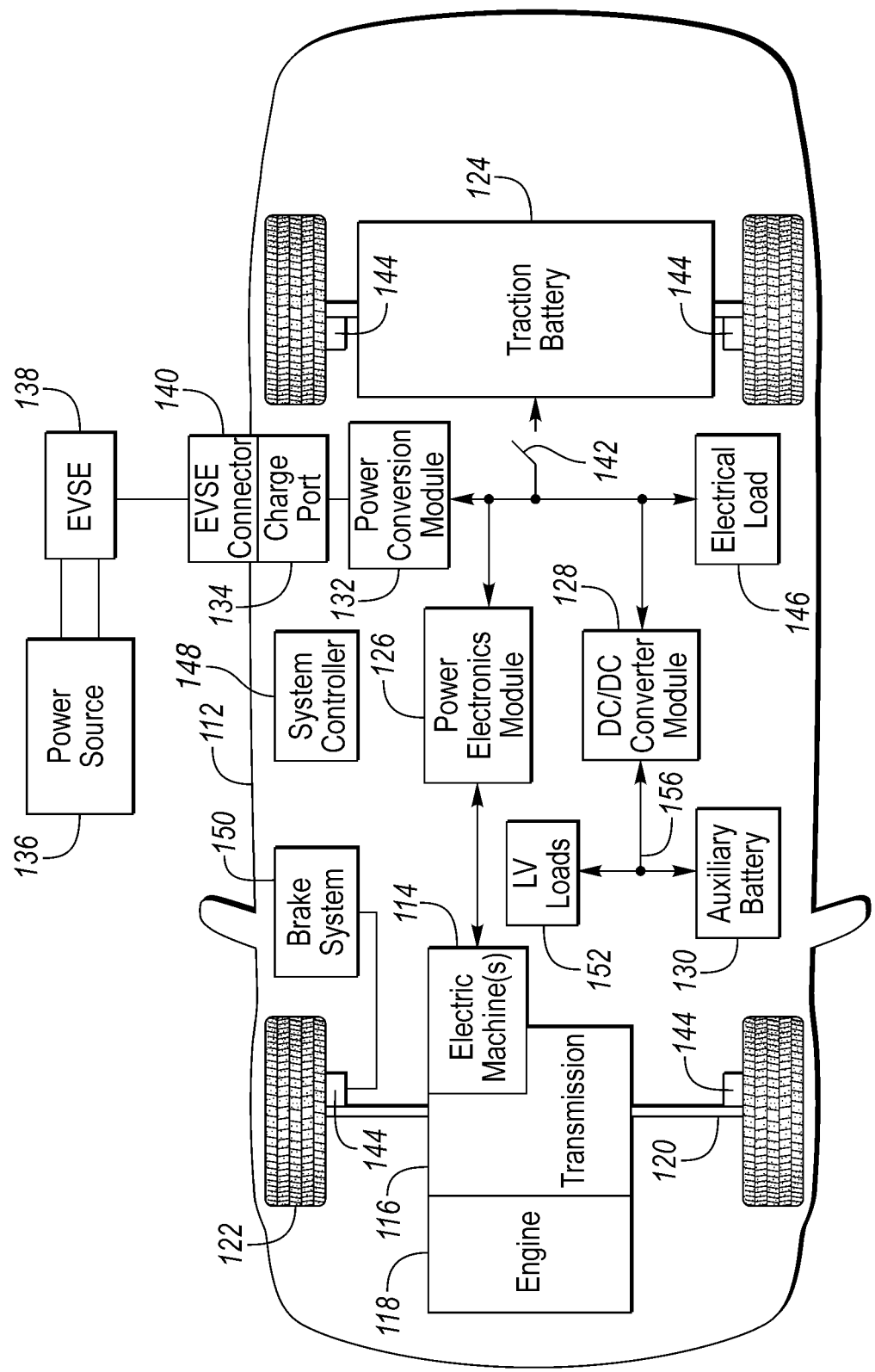
FIG. 1 is a diagram of an electrified vehicle illustrating drivetrain and energy storage components including an electric machine.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present.

A traction battery or battery pack 124 stores energy that can be used by the electric machines 114. The vehicle battery pack 124 may provide a high voltage direct current (DC) output. The traction battery 124 may be electrically coupled to one or more power electronics modules 126 (may also be referred to as a traction inverter). One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) (not shown) electrically coupled between the traction battery 124 and the power electronics module 126. The VVC may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads 152. An output of the DC/DC converter module 128 may be electrically coupled a low-voltage bus 156 and to an auxiliary battery 130 (e.g., 12V battery) for charging the auxiliary battery 130. The low-voltage systems 152 may be electrically coupled to the low-voltage bus 156. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132.

The interface of the charge port 134 and the charge connector 140 may include conductors for transferring high-voltage power between the EVSE 138 and a high-voltage DC bus of the vehicle. The interface may further include signal conductors for transferring low-voltage signals between the EVSE 138 and the vehicle.

The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

In some configurations, the electrified vehicle 112 may be configured to provide power to an external load. For example, the electrified vehicle may be configured to operate as a back-up generator or power outlet. In such applications, a load may be connected to the EVSE connector 140 or other outlet. The electrified vehicle 112 may be configured to return power to the power source 136. For example, the electrified vehicle 112 may be configured to provide alternating current (AC) power to the electrical grid. The voltage supplied by the electrified vehicle may be synchronized to the power line.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

For best range or fuel economy, the electrified vehicle 112 may recharge the traction battery 124 from an external source when not being driven. It may be desired to charge the traction battery 124 in as short a time as possible. The charging system may be configured to manage the charging of the traction battery 124 to ensure a full charge in a shortest amount of time.

Figure 2:
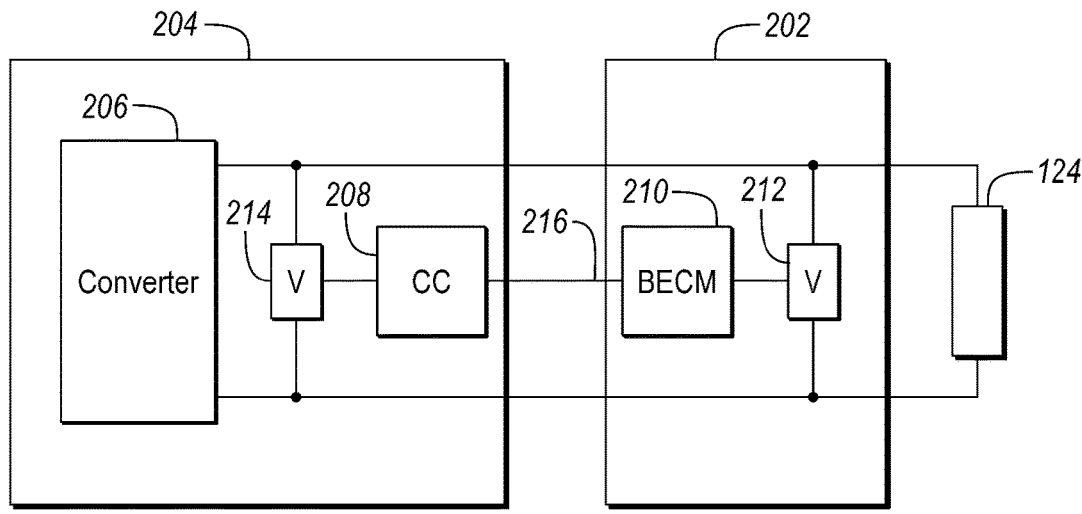
FIG. 2 is a diagram of a vehicle charging system.

The charging cycle may require interaction between onboard and offboard components to synchronize operations for charging the traction battery 124. FIG. 2 depicts a block diagram of a possible configuration for a vehicle charging system. The charging system may include a battery management system 202. The battery management system 202 may include components and circuitry for managing the operation of the traction battery 124. The battery management system 202 may include a Battery Energy Control Module (BECM) 210. The BECM may be a controller that is configured to control the operation of the traction battery 124. Operation of the traction battery 124 includes charging and discharging. The battery management system 202 may include a battery voltage sensor 212 that is configured to measure a voltage across terminals of the traction battery 124.

The battery voltage sensor 212 may be a resistive network that provides a signal indicative of the voltage across the terminals of the traction battery 124. The BECM 210 may include components and circuits to isolate the BECM 210 from high-voltage power. The BECM 210 may further include components to scale and filter the battery voltage signal for conversion to digital form. The BECM 210 may include analog-to-digital (A/D) converters for converting the analog signal to a digital value. The resolution of the digital value may be a function of the A/D converter resolution and the voltage range of the analog signal. The battery voltage signal may be used for managing the operation of the traction battery 124.

The battery management system 202 may further include sensor modules that are configured to measure battery cell properties for individual or groups of battery cells that make up the traction battery 124. The sensor modules may include voltage, current, and temperature sensors to provide operating data for the battery cells. For example, the traction battery 124 may be comprised of N battery cells connected in series. The sensor modules may be measure current, voltage and temperature associated with each of the N battery cells. In other configurations, a subset of the battery cells may be monitored. The sensor modules may be in communication with the BECM 210.

The charging system may include a charger 204. The charger 204 may include components that are onboard the vehicle and/or offboard the vehicle. The charger 204 may include a power converter 206 that is configured to provide high-voltage power to the traction battery 124. For example, the power converter 206 may be configured to convert AC power input to a DC power output for the traction battery 124. The power converter 206 may be electrically coupled to an external source. The charger 204 may include a charge controller 208 that is configured to control operation of the power converter 206. The charger 204 may include a charger voltage sensor 214. The charger 204 may be described as incorporating features of the EVSE 138, charge connector 140, charge port 134, and power conversion module 132 as depicted in FIG. 1. The power converter 206 may incorporate features of the EVSE 138 and power conversion module 132 of FIG. 1. Various features of the power converter 206 may be allocated to onboard and/or offboard components that are connected via the charge connector 140 and charge port 138. For wireless power transfer systems, the onboard and offboard components may be linked by a charger transmit coil and a vehicle receive coil.

The charger voltage sensor 214 may be a resistive network that provides a signal indicative of the voltage across the terminals at the output of the power converter 206. The charge controller 208 may include components and circuits to isolate the charge controller 208 from high-voltage. The charge controller 208 may further include components to scale and filter the charger output voltage signal for conversion to digital form. The charge controller 208 may include analog-to-digital (A/D) converters for converting the analog signal to a digital value. The resolution of the digital value may be a function of the A/D converter resolution and the voltage range of the analog signal. The charger output voltage signal may be used for managing the operation of the power converter 206. Note that the resolution of the digital signals may differ between the BECM 210 and the charge controller 208.

The BECM 210 and the charge controller 208 may communicate via a communication link 216. In cases where the charger 204 is an onboard charger, the communication link 216 may be via the vehicle network. In cases where the charger 204 is an offboard charger, the communication link 216 may be part of an electrical connection defined by the interface between the EVSE connector 140 and the charge port 134. In offboard configurations, the communication link 216 may be a wireless communication channel. The wireless communication channel may include wireless Ethernet and Bluetooth.

During charging, the BECM 210 may monitor the traction battery voltage by sampling the battery voltage sensor 212. The BECM 210 may be programmed to monitor a state of charge of the traction battery 124. The BECM 210 may monitor battery currents and temperatures and use these variables in the voltage level determination. The BECM 210 may determine the voltage level at which the traction battery 124 is to be charged. The BECM 210 may output a voltage request to the charge controller 208. The voltage request may be sent via the communication channel 216. The charge controller 208 may receive the voltage request and control the charger output voltage to achieve the voltage request. The voltage request may be a voltage level at which the traction battery 124 is fully charged. The battery full charge voltage level may be a voltage level at which the traction battery 124 has achieved a state of charge of one hundred percent. The battery full charge voltage level may be a constant value that is derived from the parameters of the traction battery 124. For example, the traction battery 124 may be characterized by a voltage/state of charge curve that may be derived from testing data. The battery full charge level may also be derived from a battery cell full charge voltage multiplied by the number of series-connected battery cells in the traction battery 124.

The charge controller 208 may be programmed to receive the voltage request. The charge controller 208 may control the charger output voltage to achieve the voltage request. The charge controller 208 may control operation of the power converter 206 to adjust the charger output voltage to achieve the requested voltage. The charge controller 208 may further operate the power converter 206 within predetermined current limits. The charge controller 208 may control the charger output voltage to prevent the charge current from exceeding a maximum current limit. The maximum current limit may be a function of the power capability of the traction battery 124 and/or the power capability of other components in the charging system. During periods in which the charge current is limited, the charger output voltage may be at a voltage level that is less than the voltage request. For example, at lower states of charge, the traction battery voltage may be significantly below the voltage request. Application of the voltage request that is the battery full charge voltage level may result in a large current flowing through the system. The charge controller 208 may operate the power converter 206 such that the charger output voltage delivers no more than the maximum current limit. As the battery state of charge increases, the battery voltage may increase and the charger output voltage may be increased to achieve the voltage request over time subject to maintaining the current limitations.

The charge controller 208 may be programmed to measure the charger output voltage by sampling the charger voltage sensor 214 at predetermined intervals. The charge controller 208 may be programmed to output the measured charger output voltage value to the BECM 210 via the communication channel 216. The BECM 210 may be programmed to receive the charger output voltage value.

The BECM 210 may output the voltage request via the communication channel 216. As described, the charger output voltage may be controlled to achieve the voltage request. Issues can arise when the voltage measurements are affected by measurement errors. That is, when the battery voltage sensor 212 and the charger output voltage sensor 214 measure different voltages due to noise, measurement errors, resolution, and/or offset issues. These issues may be noticed at higher battery states of charge. When the voltage request is set to the battery full charge voltage level, the battery voltage is expected to approach the battery full charge voltage level. As the battery voltage approaches the battery full charge voltage level, the current may decrease. In the case of no measurement errors this causes no problems.

However, due to measurement errors, the charger output voltage may not actually be the battery full charge voltage. In some cases, the charger output voltage may be less than the battery full charge voltage. In this case, the current may decrease prematurely and the battery full charge voltage may not be achieved as quickly. This results in a low current flowing to charge traction battery 124. As a result, the charging time may increase.

For example, the battery voltage measurement may be several volts below the charger output voltage measurement. However, at higher states of charge, the voltage request may only be several volts above the battery voltage measurement. This may result in the charge current being lower than desired. In this case, the charge current may be too low which may result in a charge cycle being excessively long. As such, compensating the charging system for the effects of measurement errors may improve charge times.

Charger measurement errors can be in the range of two percent. The error may depend on the charger design and component tolerances. Further, a variety of factors can affect the measurement error. Environmental factors may affect the measurement error. As such, a fixed measurement error cannot be assumed. A system that learns the voltage measurement error may allow compensation and improve charge times.

Methods of compensating the charging system for measurement errors are disclosed herein. A first method may be referred to as a static evaluation. The BECM 210 may execute the static evaluation whenever computing the voltage request. The static evaluation computes a measurement error as a difference between a charger reported output voltage and a battery measured terminal voltage. The measurement error may be limited to be no less than zero. That is, the measurement error may not be permitted to fall below zero.

A second method may be referred to as a running average evaluation. The BECM 210 may execute the running average evaluation whenever computing the voltage request. The running average evaluation may compute the voltage measurement error as a filtered version of the difference between the charger reported output voltage and the battery measured terminal voltage. The difference may be limited to be no less than zero. The formula may be expressed as:

$$E(k+1)=\alpha*E(k)+(1-\alpha)*\max(V_c-V_b,0) \tag{1}$$

where E(k) is the voltage measurement error evaluated during the previous time cycle, $V_c$ is the charger voltage measurement, $V_b$ is the battery voltage measurement, and $\alpha$ is a forgetting factor at which the measurement error forgets previous errors. The forgetting factor may be a value between 0 and 1 (or 0 and 100%). The formula filters the estimated error and helps to prevent frequent changes which the charger may not be able to respond to. The estimated voltage measurement error may be a sum of a first predetermined percentage ($\alpha$) of the previously estimated voltage measurement error and a second predetermined percentage ($1-\alpha$) of a difference between the charger output voltage value and the measured traction battery voltage. In this formulation, the sum of the first predetermined percentage and the second predetermined percentage is one hundred percent. The $\max(V_c-V_b, 0)$ term limits the difference to be no less than zero. In some configurations, the $\max(V_c-V_b, 0)$ term may be replaced by the difference $V_cV_b$.

The voltage request may be adjusted based on voltage measurement error as determined by the static evaluation or the running average evaluation. The voltage request may be a sum of a battery full charge voltage and the voltage measurement error. The battery full charge voltage may be a voltage value that indicates when the battery is fully charged. The battery full charge voltage may be a constant value that depends on the traction battery configuration. In some configurations, the battery full charge voltage may be a product of a battery cell full charge voltage and a number of battery cells in the traction battery.

The selection of the static evaluation or the running average evaluation may depend on various factors. When the measurement noise characteristics indicate a slowly varying measurement error or small variations in the measurement error, the static evaluation may be selected. When the measurement noise characteristics indicate a rapidly changing measurement error or large variations in the measurement error, the running average evaluation may be selected. The charger response time may also be factored into the selection. For example, if the expected rate of change of the measurement error exceeds a predetermined rate that is a maximum charge response rate, then the running average evaluation may be selected. This prevents the system from trying to operate the charger to respond to a change that it cannot satisfy.

The selection between the static evaluation and the running average evaluation may be performed in real-time. For example, the default strategy may be the static evaluation. The rate of change or derivative of the estimated voltage measurement error may be computed and monitored. If the derivative exceeds a predetermined rate, then the system may switch to using the running average evaluation.

The effect of adding the voltage measurement error to the voltage request is to increase the voltage request, thereby increasing the charger output voltage. This allows the traction battery 124 to be charged at a higher level so that a complete charge is reached in a shorter time.

Figure 3:
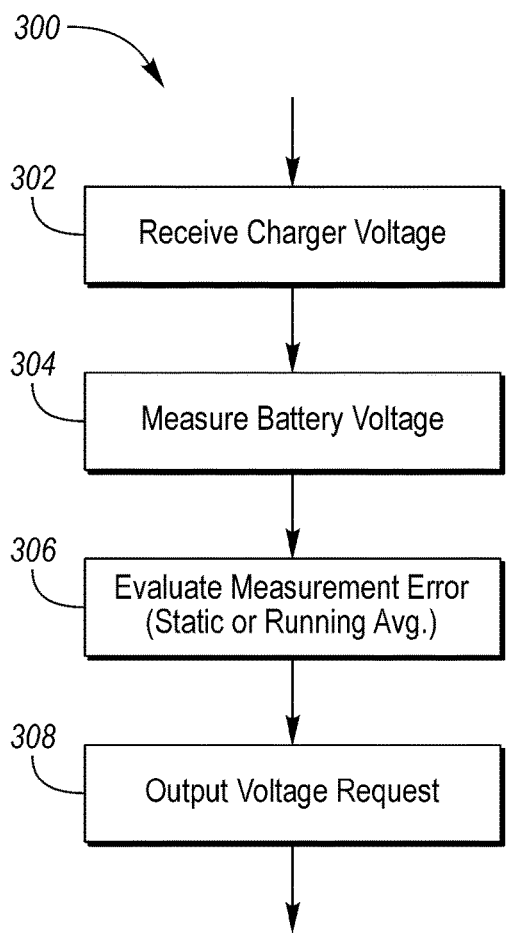
FIG. 3 is a flowchart for a possible sequence of operations for a battery management system.

FIG. 3 depicts a flow chart of a first sequence 300 of operations that may be implemented in the BECM 210. At operation 302, the BECM 210 may receive the charger output voltage from the charge controller 208. At operation 304, the BECM 210 may measure the traction battery voltage by sampling the battery voltage sensor 212. At operation 306, the BECM 210 may evaluate the voltage measurement error as described above. For example, the evaluation may be performed using static or running average evaluation methods as described. At operation 308, the BECM 201 may output the voltage request to the charge controller 208.

Figure 4:
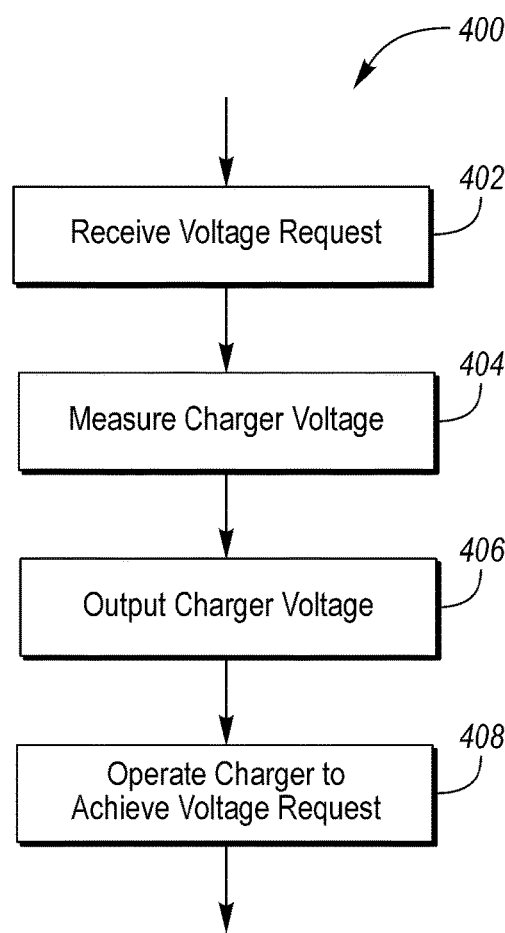
FIG. 4 is a flowchart for a possible sequence of operations for a charger controller.

FIG. 4 depicts a flow chart for a second sequence 400 of operations that may be implemented in the charge controller 208. At operation 402, the charge controller 208 may receive the voltage request from the BECM 210. At operation 404, the charge controller 208 may measure the charger output voltage by sampling the charger voltage sensor 214. At operation 406, the charge controller 208 may output the charger output voltage value to the communication channel 216. At operation 408, the charge controller 208 may operate the power converter 206 to achieve the voltage request.

The system and methods described improve the charge time of the traction battery in the presence of voltage measurement errors. The system reduces the chance of the charging voltage resulting in a low charge current.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
    a charger configured to adjust an output voltage to satisfy a voltage est, and to out it a measured output voltage;
    a traction battery; and
    a controller programmed to
        measure a terminal voltage of the traction battery and receive the measured output voltage,
        output the voltage request as a sum of a full charge voltage and an estimated voltage measurement error between the measured output voltage and the terminal voltage,
        estimate the estimated voltage measurement error as a difference between the measured output voltage and the terminal voltage, and
        limit the difference to be no less than zero.

2. A battery management system comprising:
    a controller programmed to receive a charger voltage value from a charger, measure a traction battery voltage during charging, and output a voltage request to the charger that is a sum of a predetermined voltage and an estimated measurement error that includes a first predetermined percentage of a previously estimated measurement error and a second predetermined percentage of a difference between the charger voltage value and the traction battery voltage, wherein the predetermined voltage is a voltage level at which a traction battery represented by the traction battery voltage is fully charged.

3. The battery management system of claim 2 wherein the first predetermined percentage is zero and the second predetermined percentage is one hundred percent.

4. The battery management system of claim 2 wherein a sum of the first predetermined percentage and the second predetermined percentage is one hundred percent.

5. The battery management system of claim 2 wherein the controller is further programmed to generate the estimated measurement error as a sum of the first predetermined percentage of the previously estimated measurement error and the second predetermined percentage of the difference between the charger voltage value and the traction battery voltage, wherein the sum is limited to be no less than zero.

6. A method comprising:
operating a charger to drive a charger output voltage to satisfy a voltage request received from a controller; and
receiving, by the controller, a measured charger output voltage from the charger and outputting the voltage request to the charger as a sum of a battery full charge value and a voltage measurement error between the measured charger output voltage and a measured battery voltage, wherein the battery lull charge value is a voltage at which a corresponding battery is fully charged.

7. The method of claim 6 further comprising estimating, by the controller, the voltage measurement error as a difference between the measured charger output voltage and the measured battery voltage.

8. The method of claim 6 further comprising limiting, by the controller, the voltage measurement error to be no less than zero.

9. The method of claim 6 further comprising estimating, by the controller, the voltage measurement error as a sum of a first predetermined percentage of a previously output voltage measurement error and a second predetermined percentage of a difference between the measured charger output voltage and the measured battery voltage.

10. The method of claim 9 further comprising limiting, by the controller, the difference between the measured charger output voltage and the measured battery voltage to be no less than zero.

11. The method of claim 9 wherein a sum of the first predetermined percentage and the second predetermined percentage is one hundred percent.

12. The method of claim 6 further comprising estimating, by the controller and responsive to a rate of change of a difference between the measured charger output voltage and the measured battery voltage exceeding a predetermined rate, the voltage measurement error as a sum of a first predetermined percentage of a previously output voltage measurement error and a second predetermined percentage of the difference.

* * * * *